United States Patent
Eid et al.

(10) Patent No.: US 7,256,646 B2
(45) Date of Patent: Aug. 14, 2007

(54) NEUTRALIZATION TECHNIQUES FOR DIFFERENTIAL LOW NOISE AMPLIFIERS

(75) Inventors: Salem Eid, Wappingers Falls, NY (US); Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 12 days.

(21) Appl. No.: 11/157,246

(22) Filed: Jun. 21, 2005

(65) Prior Publication Data

US 2006/0284670 A1 Dec. 21, 2006

(51) Int. Cl.
*G06G 7/12* (2006.01)
*H03F 3/45* (2006.01)

(52) U.S. Cl. ....................... 327/563; 330/260
(58) Field of Classification Search ............... 330/260, 330/264–265, 292, 302; 327/67, 89, 563
See application file for complete search history.

(56) References Cited

U.S. PATENT DOCUMENTS

| | | | | |
|---|---|---|---|---|
| 6,624,699 | B2 * | 9/2003 | Yin et al. | 330/260 |
| 6,819,182 | B2 | 11/2004 | Sibrai | 330/288 |
| 7,082,293 | B1 * | 7/2006 | Rofougaran et al. | 455/260 |
| 2004/0232982 | A1 | 11/2004 | Ichitsubo et al. | 330/129 |

OTHER PUBLICATIONS

The Design of CMOS Radio-Frequency Integrated Circuits, Second Edition; Thomas H. Lee, Cambridge University Press 1998, pp. 294-297.

* cited by examiner

*Primary Examiner*—My-Trang Nu Ton
(74) *Attorney, Agent, or Firm*—Rosalio Haro (57) ABSTRACT

An differential LNA has first and second input MOS transistors, with differential inputs applied to their respective control gates and differential outputs taken at their respective drains. The gate-to-drain, Cgd, feedback capacitances of the first and second input MOS transistors are neutralized by respective gate-to-source, Cgs, capacitances in the two neutralizing MOS transistors. A first neutralizing MOS transistor has its control gate coupled to the control gate of the first input MOS transistor, its source node coupled to the drain node of the second input MOS transistor, and its drain node coupled to a fixed potential. A second neutralizing MOS transistor has its control gate coupled to the control gate of the second input MOS transistor, its source node coupled to the drain node of the first input MOS transistor, and its drain node coupled to the same fixed potential. In this manner, similar and opposite potential differences between the gate-and-drain and the drain-and-source regions of the first input MOS transistor are reproduced in gate-and-drain and drain-and-source regions of the first neutralizing MOS transistor. A similar affect is produced in the second input and second neutralizing MOS transistor.

24 Claims, 6 Drawing Sheets

NEUTRALIZATION TECHNIQUES FOR DIFFERENTIAL LOW NOISE AMPLIFIERS

BACKGROUND OF THE INVENTION

1. Field of the Invention

The present invention relates to the field of differential low noise amplifiers, LNA. Specifically, the present invention relates to improving input-output isolation in an LNA.

2. Description of the Related Art

The first stage of a high frequency receiver is typically a low-noise amplifier, LNA. The LNA is particularly a key component in wireless communication applications. In such systems, LNAs are used to receive and amplify a signal from an antenna without adding significant noise to the receiver. In addition to amplifying a received signal, typically the LNA is also required to provide a specific input impedance at a prescribed operating frequency. This impedance requirement is particularly important since the impedance quality can greatly affect the performance of passive filters that may precede the LNA. Overall the LNA is one of the most important circuit blocks in a receiver chain for determining the noise performance of the overall receiver chain.

The input impedance requirement places practical limitations on the physical configuration of an LNA-type amplifier. That is, basic (lower frequency) amplifier configurations and techniques may not be suitable for LNA applications. For example, the basic common-source amplifier configuration 9 (shown in FIG. 1) is not suitable for a LNA applications. Common-source amplifier 9 includes an MOS transistor 11 having its source terminal directly coupled to hard ground, GND, its drain coupled to Vcc via a load resistor RL, and its control gate coupled to a signal source 12. Signal source 12 has an inherent output (i.e. source) impedance RS, and outputs an input signal, Vin, to amplifier 9 via source impedance RS. In order to reduce signal reflection and maximize power transfer, amplifier 9 is typically required to provide an input impedance, Rin, that matches source impedance RS. A typical value for RS is 50Ω, and a correspondingly matching input impedance Rin of 50 Ω is likewise typically required at the input of amplifier 9. It is to be understood that this value of 50Ω is purely for illustrative purposes, and any other value for source impedance RS may be defined without deviating from the present discussion.

Figures 1, 2:
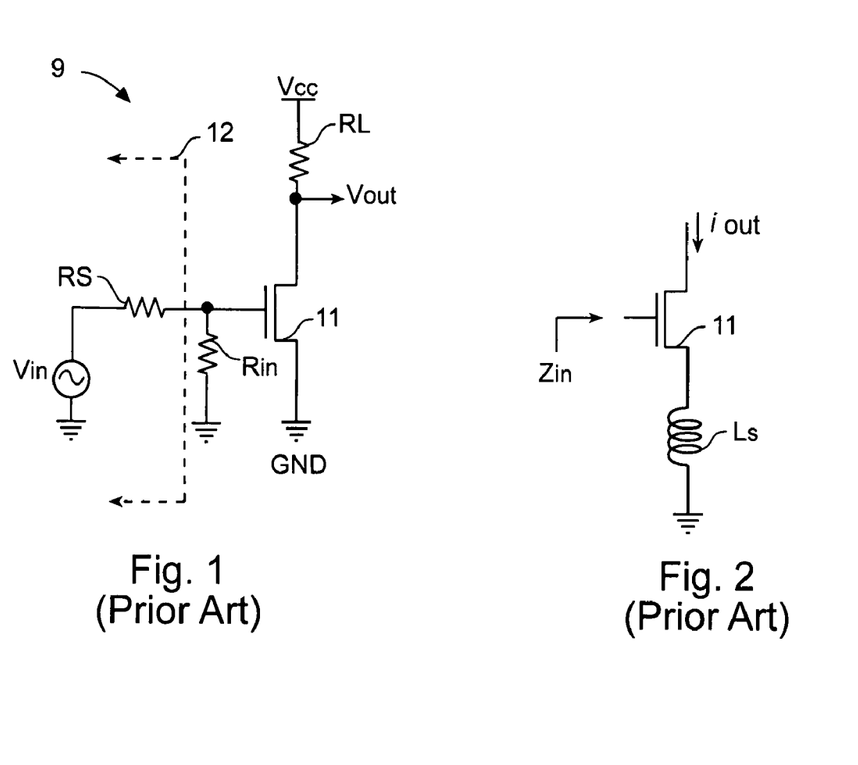
FIG. 1 is a prior art common source amplifier.
FIG. 2 demonstrates a partial method of using an MOS transistor to produce an ohmic input impedance at the transistor's control gate.

Nonetheless, a common method of meeting this input impedance requirement is to simply place a matching 50 Ω input resister, i.e. Rin, across the input terminal of common source amplifier 9. This approach is indeed suitable for many lower frequency applications, but it is ill-suited for high frequency applications (i.e. at which LNA-type amplifier are typically used). Input resister Rin adds thermal noise and attenuates a received signal. These two effects generally result in unacceptable noise figures, which make the use of a physical input resistor unsuitable for high-frequency, low-power applications, and thus unsuitable for LNA-type amplifiers.

The active component of an LNA-type amplifier is typically an MOS transistor, whose control gate structure in essence constitutes a parallel plate capacitor. Consequently, the control gate of the MOS transistor exhibits an inherently capacitive input impedance. Therefore, attempting to use the control gate as the input to an MOS transistor to provide an ohmic (not capacitive) input impedance (such as a matching 50Ω input resistance) without adding a physical resistor (to avoid the noise characteristics of physical resistors) may appear to be a futile endeavor. However, MOS transistors have what is termed a nominally capacitive input impedance, and not a purely capacitive input impedance. A physical MOS transistor does exhibit a real input impedance component in addition its capacitive input impedance component. This real impedance component is at least partly due to a finite carrier velocity in the channel (i.e. bottom plate) of an MOS transistor, which results in a bottom plate potential that lags an applied potential at the control gate and thus exhibits a resistive component in its input impedance. Since this lag effect is dependent upon the frequency of an applied input signal, the value of the input ohmic resistance is likewise dependent upon frequency. Nonetheless this phenomena permits an LNA-type amplifier to provide a resistive input impedance without a physical input resistor, within a prescribed operating frequency range.

By increasing this lag effect, an ohmic input impedance without the added noise of a real resistor can be created at the control gate of an MOS transistor. There are several methods for increasing this lag effect in the channel of the transistor, such as simply elongating the channel of the transistor. However, this approach affects the overall performance of the transistor. Generally in an LNA amplifier, inductive source degeneration is used to enhance the lag of current flow in the channel due to an applied input signal. An advantage of this approach is that the real (i.e. ohmic) component of the input impedance can be controlled by selection of an appropriate inductance at the source terminal of the MOS transistor.

This approach is illustrated in FIG. 2, where inductor Ls is added at the source electrode of MOS transistor 11 to provide inductive source degeneration. In this case, the input impedance Zin effectively behaves as a series RLC network with a resistive component proportional to the inductance value of Ls. It should be noted that the input impedance Zin would be purely resistive only at resonance (i.e. where the reactive components of the input impedance cancel out), and thus impedance matching is typically provided for only a narrow frequency range of operation. However, LNA-type amplifiers are typically used in narrow band applications, so this narrow-band operation limitation is typically not critical a hindrance.

Figure 3:
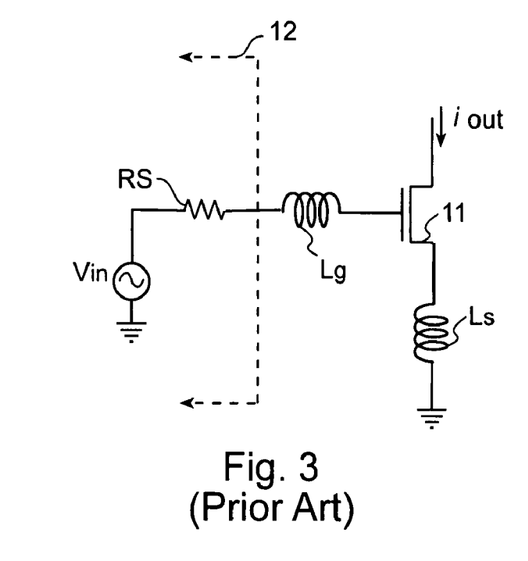
FIG. 3 is a more complete view of the structure of FIG. 2 with the addition of an input signal source.

With reference to FIG. 3, since inductor Ls provides the desired input resistance only when operating at resonance, a second gate inductor Lg is typically applied at the control gate of transistor 11 to assure that resonance is achieved. That is, the inductance value of Ls necessary for providing a desired input ohmic impedance is first selected. Typically the desired input impedance is selected to match the source resistance Rs of the input signal source 12. The value of Ls needed to produce the desired input resistance, however, may not necessarily be at resonance at the desired operating frequency of the LNA. Since Ls will produce a purely resistive impedance only when the input loop is at resonance, gate inductance Lg is then adjusted to provide enough series inductance with the gate input to push that the input loop into resonance at the desired amplifier operating frequency for the given value of Ls.

Figure 4:
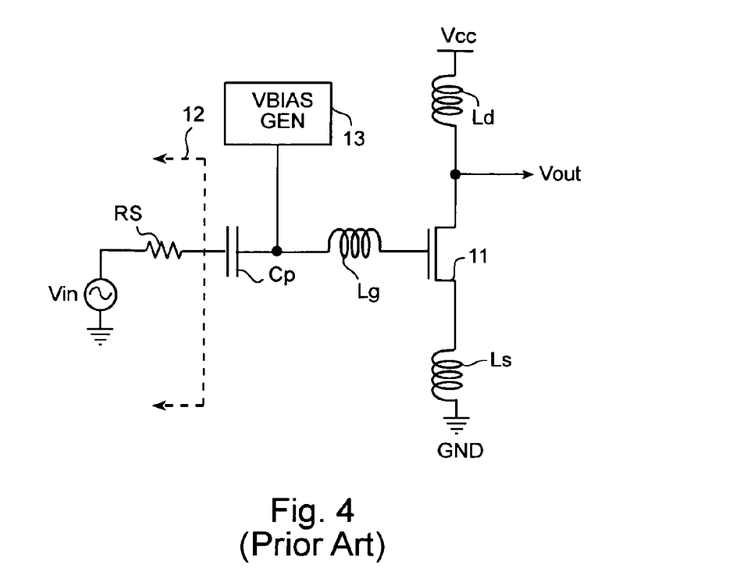
FIG. 4 demonstrates the structure of a basic single-ended low noise amplifier, LNA, and input signal source.

With reference to FIG. 4, where all elements similar to those of FIGS. 1–3 have similar reference characters and are described above, a more complete view of a basic LNA structure includes a voltage bias generator 13, a coupling capacitor Cp, and a third inductor Ld coupling the drain electrode of MOS transistor 11 to the Vcc power rail. Voltage bias generator 13 establishes the operating point for the LNA, as determined from power constraints. Coupling capacitor Cp provides DC blocking to prevent disturbance of the gate-to-source biasing of transistor 11. The inductance value of inductor Ld operates in conjunction with the drain capacitance of MOS transistor 11 to increase gain and provide bandpass filtering at the output.

Figure 5:
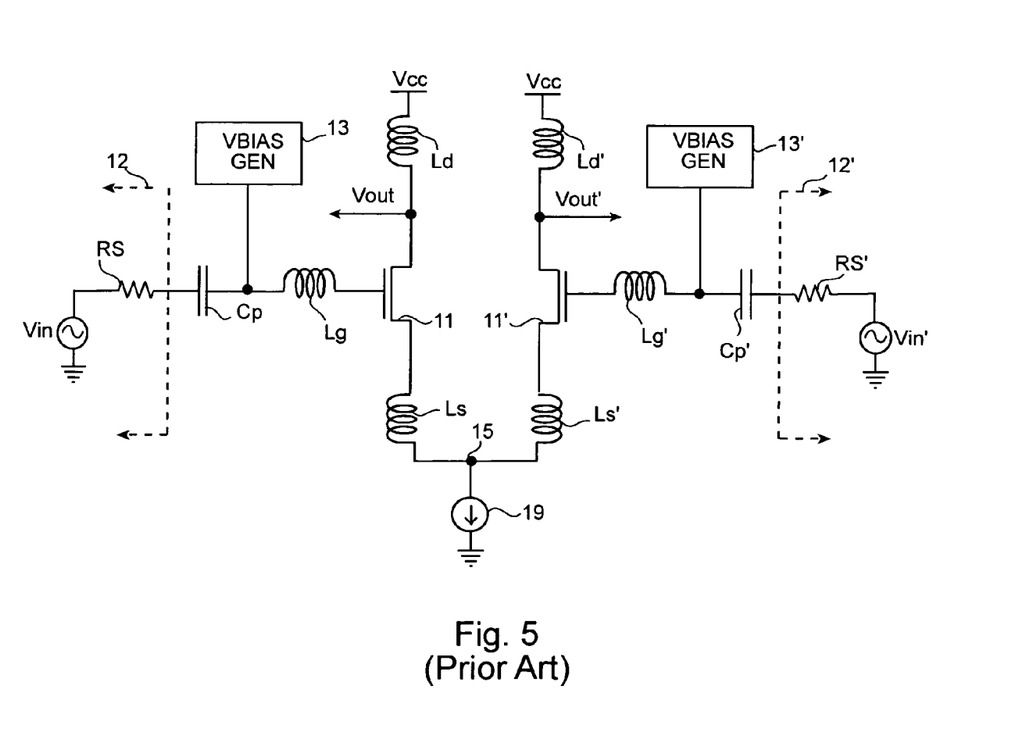
FIG. 5 extends the structure of the LNA of FIG. 4 to construct a basic differential LNA, with exemplary differential input signal sources.

The LNA of FIG. 4 is a single-ended structure, and it is therefore sensitive to parasitic ground inductance. This can be remedied by using a differential LNA structure, as shown in FIG. 5, where all elements similar to those of FIG. 4 have similar reference characters. The differential structure 17 includes a current source 19 that establish a virtual ground 15 at the point of symmetry between the two differential branches.

The differential LNA 17 operates on both true Vin and complement Vin' forms of an input signal and thus has a true 17a and complementary 17b LNA branch. All elements in the complementary LNA branch 17b that complement those of the true LNA branch 17a have similar reference characters with the addition of prime symbol ('), and their behavior is similar to those of the true LNA branch 17a, as described above in reference to FIGS. 2–4. For simplicity, two input signal sources 12 and 12' providing two respective input signals Vin and Vin', along with their corresponding source impedances Rs and Rs', are shown. It is to be understood, however, that Vin and Vin' are complements of each other and may originate from a single, distant differential signal source. Similarly, two voltage bias generators 13 and 13' are shown, but it is to be understood that a single voltage bias generator may be used to bias both the true 17a and complementary 17b branches of differential LNA 17.

Current source 19 isolates virtual ground node 15 from parasitic ground inductances so that the real component of the input impedance is controlled primarily by Ls (or Ls'). An additionally benefits of the differential LNA structure is that it rejects common-mode disturbances as well as improving linearity and dynamic range.

Differential LNA structures began to be used more and more staring in the late 1990's. Use of differential LNA's was driven by the increasing use of the direct conversion receiver (DCR). The DCR topology with differential structures helps improve second order inter-modulation and linearity.

LNA-type amplifiers, however, typically do not have the simplified structures of FIGS. 4 and 5. This is because although the noise figure is not much affected by the gate-to-drain capacitance, Cgd, of MOS transistor 11, Cdg can affect the input impedance. Additionally, the output of an LNA is typically tuned differently than the input, and thus it is helpful to isolate the output form the input. Also it is important prevent leakage from the output signal back to the input stage since the leakage can radiate out through the input stage. For example, an LNA may receive and amplify a signal from an antenna while adding some noise. If its isolation between the input and output is not at a certain level, the signal at the output can go back to the antenna where it can radiate and create interference for other applications or other users of the same application.

Figure 6:
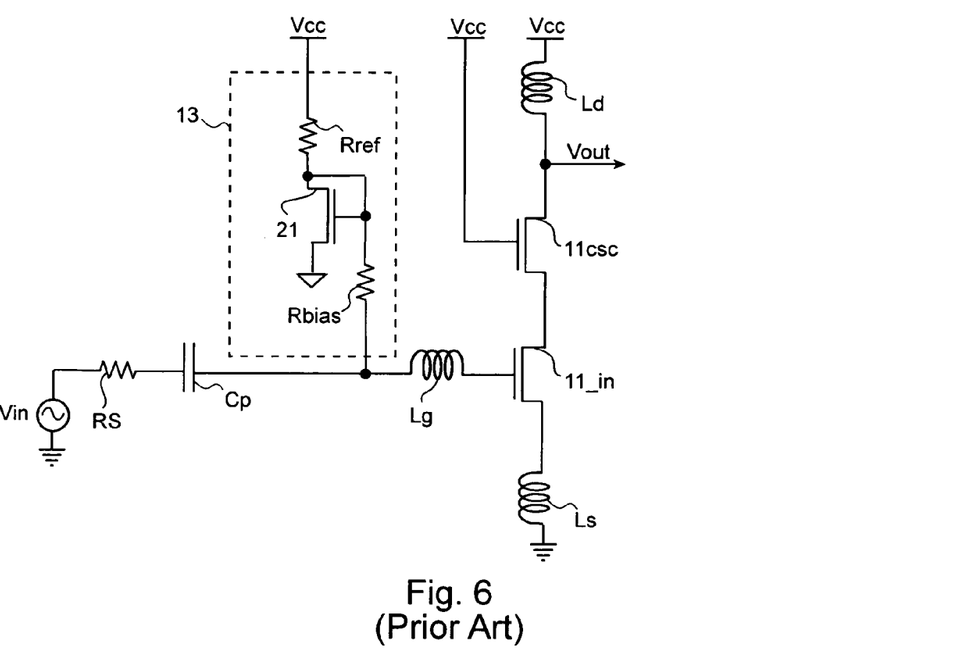
FIG. 6 shows a classic single-ended LNA having a cascode configuration for improving isolation between its input and output.

With reference to FIG. 6, most low noise amplifiers found in the literature use a cascode topology to reduce the effects of the input transistor's 11 Cgd. In FIG. 6, a single-ended configuration is shown for the sake of clarity, but it is to be understood that the structure of FIG. 6 can be readily extended to a differential LNA structure. The cascode topology replaces the single input transistor 11 with a cascode structure 20 consisting of two transistors, the primary input transistor 11_in in series with a cascode transistor 11csc. The control gate of cascode transistor 11csc is typically tied to the high power supply Vcc to maximize the voltage across input transistor 11_in. The operation of a cascode structure 20 is well known and is not elaborated upon here. In essence, the cascode transistor 11csc reduces the gain of the common-source configuration of input transistor 11_in, and thereby reduces the capacitor multiplying action of the Miller effect upon input transistor 11_in, while at the same time providing isolation between the control gate of input transistor 11_in and the output at the drain of cascode transistor 11csc. Thus, the cascode structure 20 improves the isolation between the input and the output. This implies that an input signal received by an antenna (not shown) and applied to the LNA will ideally have no reflections from the output of the LNA back to the input.

Also shown in FIG. 6 is an example of a typical voltage bias circuit 13. Voltage bias circuit 13 may consist of reference resistor Rref in series with a diode-connected transistor 21, with a bias resistor Rbias coupling the gate of transistor 21 to the gate of input transistor 11_in. The reference current through diode-connected transistor 21 is determined by the value of Rref and the voltage difference between Vcc and the Vgs of transistor 21. Rref is typically made large enough so that its noise current is small enough to be ignored. Transistor 21 essentially forms a current mirror with input transistor 11_in, by which the bias operating point of input transistor 11_in is established.

Figure 7:
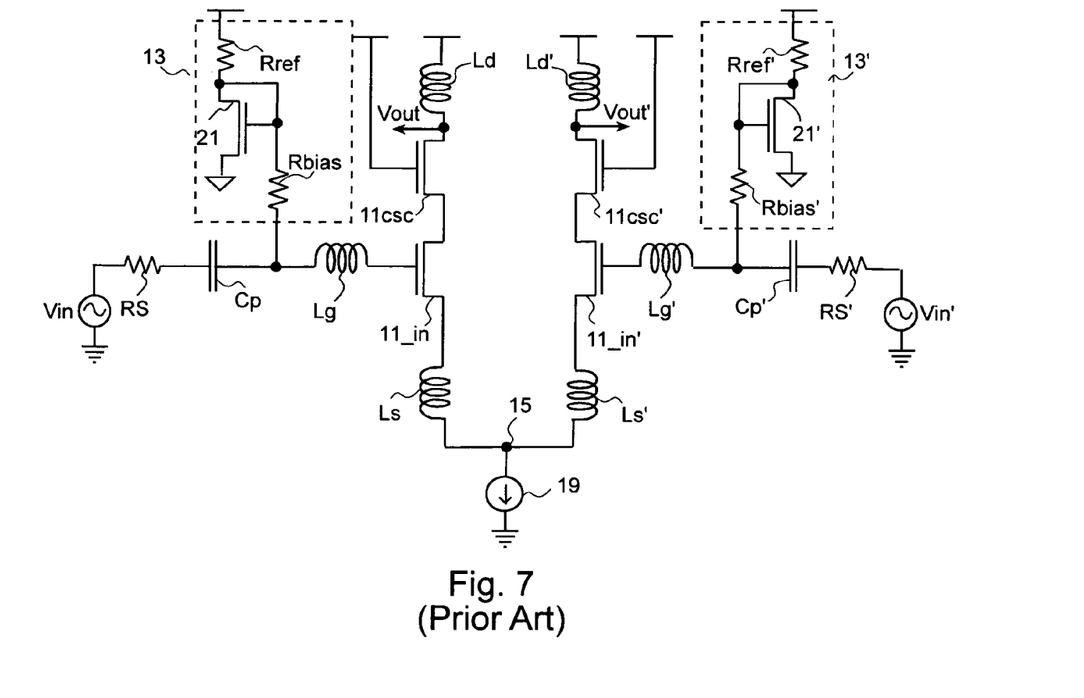
FIG. 7. shows a differential LNA having a cascode configuration.

With reference to FIG. 7, a differential LNA-type amplifier with a cascode structure is shown for the sake of completeness. All elements similar to those of FIG. 6 have similar reference characters and are described above. For the sake of clarity, as in the case of FIG. 5, the bias circuitry and input signals are duplicated for the true and complement branches of the differential LNA, but it is to be understood that a single bias circuit may bias both branches of the differential LNA and the true and complementary input signals may originate from a common differential signal source. Also as in the case of FIG. 5, the complementary components have a prime symbol (') appended to their corresponding reference character, and are described above. The complementary outputs are therefore available at nodes Out and Out'.

Although the cascode structure reduces the Miller effect and provides isolation between the input and output, and is consequently very popular in LNA architectures, it achieves these benefits at the sacrifice of voltage headroom. That is, the available voltage headroom (i.e. the difference between Vcc and GND as further reduced by voltage drops across any series-connected components between Vcc and GND) for circuit operation is reduced by requiring two transistors 11_in and 11csc in series, as opposed to the single transistor 11 of the basic LNA structure of FIGS. 4 and 5. This means that it will take a smaller Vin signal level to saturate the cascode LNA circuits of FIGS. 6 and 7 as compare to the basic LNA circuits of FIGS. 4 and 5.

Other methods of compensating for, or neutralizing, the Miller effect are known, but are not considered suitable for modern LNA applications. For example, a neutralization technique developed for AM radio broadcast in the 1920's for a single-ended amplifier uses a tapped inductor, or autotransformer, to provide a feedback signal through a capacitor to the input of an active device that is 180° out of phase with the output of the active device. Application of this technique to a non-LNA MOS amplifier is shown in "The Design of CMOS Radio-Frequency Integrate Circuits", © Cambridge University Press 1998, © Thomas H. Lee 2004, by T. H. Lee, page 296, which is hereby incorporated by reference. But this approach is unsuited for integrated circuit, IC, implementation due to the large area requirements and poor quality of integrated tapped transformers.

A second approach based on a similar principle, but which traditionally has not been broad applicable to integrated circuits, makes use of the dual outputs of a differential amplifier being 180° out of phase to eliminate the need for the autotransformer. This approach is described in "The Design of CMOS Radio-Frequency Integrate Circuits", © Cambridge University Press 1998, © Thomas H. Lee 2004, by T. H. Lee, pages 296–297, which is hereby incorporated by reference. In this case, the output of one branch of a differential amplifier is coupled to the input the second branch through a capacitor, and vise-versa. In order for this neutralization technique to be applicable to MOS integrated circuits, precise matching of the feedback capacitor with the Cgd of the amplifier transistor is required. However, since the Cgd of an MOS transistor is voltage-dependent (i.e. it varies with an applied potential) precise matching with the feedback capacitor has not been realizable. Therefore, this technique has traditionally had only limited application in semiconductor amplifiers. This difficulty in matching capacitances is particularly important in LNA amplifiers, where a mismatch in the feedback capacitor could set-up a separate resonance through the feedback capacitor leading to instabilities. Consequently, this approach has traditionally been limited to vacuum tube technology, which have highly linear and relatively constant coupling capacitances.

What is needed, therefore, is a method of isolating the input and output of an integrated MOS LNA circuit without losing additional voltage headroom, as compared to the basic MOS LNA circuit.

OBJECTS OF THE INVENTION

It is an object to provide an LNA circuit suitable for IC applications that provides improved input-output isolation without reducing available voltage headroom as compared to a classical LNA.

It is another object to provide a variable capacitor that more accurately tracts the gate-to-drain capacitance, Cgd, of an MOS transistor during normal operation of the MOS transistor.

SUMMARY OF THE INVENTION

These objects are met in an LNA that uses two variable capacitive sources, i.e. variable capacitors, that closely track the feedback capacitance of an LNA's two input transistors. For example, in an MOS-based LNA, the two input transistors are typically two MOS transistors, each having a respective drain node coupled to an upper power rail through a first inductive device, a respective source node coupled to a lower power rail through a second inductive device, and an input control gate. If the drain of an input MOS transistor is used as the output, then a feedback path from the output to the input is typically created through the gate-to-drain intrinsic capacitance of the input MOS transistor.

The present invention neutralizes this feedback Cgd capacitance by providing a variable capacitive source, i.e. a variable capacitor, coupled between the control gate of an LNA's first input MOS transistor to the drain of the LNA's second input MOS transistor. The variable capacitor tracks the Cgd of the first input MOS transistor, but is little affected the gate-to-source capacitance of the first input MOS transistor. In this manner it can more closely match the feedback Cdg capacitance, alone, of the first input MOS transistor.

Furthermore, since a change in potential difference between the source and drain of the of the first MOS transistor can also affect the amount of feedback current through the first MOS transistor's Cgd capacitance, the present variable capacitor is also made to limit current in a similar manner.

A second variable capacitor is provided to neutralize the feedback current through the LNA's second input MOS transistor.

To achieve this, each variable capacitor of the present invention is implemented as a neutralizing MOS transistor. A first neutralizing MOS transistor is made to match the first MOS input transistor, and a second neutralizing MOS transistor is made to match the second MOS input transistor. Preferably, the first and second neutralizing transistors and first and second input MOS transistor all match each other, and all have a symmetrical structure such that there is substantially no structural difference between each transistor's source region and drain region.

In the present case, the first neutralizing MOS transistor, which is used to neutralize the feedback current through the first input MOS transistor's Cgd, has its drain node coupled to a fixed potential, its control gate coupled to the control gate of the first input MOS transistor, and its source node coupled to the drain node of the second input MOS transistor. Similarly, the second neutralizing MOS transistor, which is used to neutralize the feedback current through the second input MOS transistor's Cgd, has its drain node coupled to the same fixed potential, its control gate coupled to the control gate of the second input MOS transistor, and its source node coupled to the drain node of the first input MOS transistor.

Preferably, the potential at the drain of the first input MOS transistor is always 180° out of phase with the potential at the drain of the second input MOS transistor. Therefore, the present configuration produces a potential difference across the gate-to-source capacitance, Cgs, of the first neutralizing transistor that is equal and opposite to the potential across the Cgd of the first input MOS transistor. Since the capacitive value of the Cgs of the first neutralizing transistor is matched to the Cgd of the first input MOS transistor, a compensating current through the Cgs of the first neutralizing MOS transistor is created that neutralizes the feedback current through the Cgd of the first input MOS transistor. A similar compensating current is created through the Cgs of the second neutralizing MOS transistor that neutralizes the feedback current through the Cgd of the second input MOS transistor.

Furthermore, the general voltage difference across the drain and source of the first input MOS transistor is reproduced across the source and drain of the first neutralizing MOS transistor. This further aids in appropriately sizing the compensating current to more closely match the feedback current through the Cgd of the first input MOS transistor.

A similar structure is applied to the second input MOS transistor. Also preferably, the drains of the first and second neutralizing MOS transistors are tied to the upper power rail, Vcc.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 8:
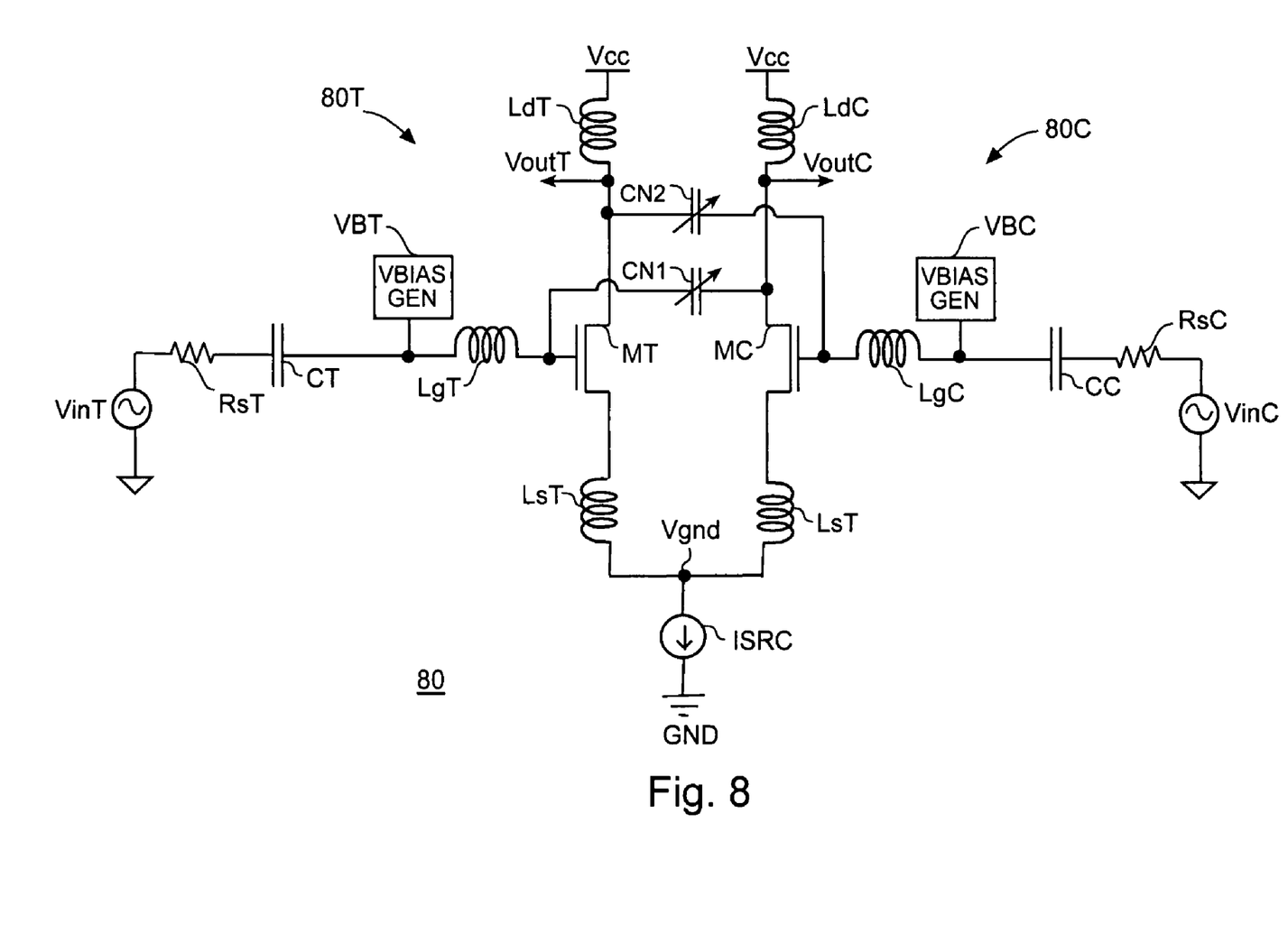
FIG. 8 a differential LNA in accord with the present invention for isolating the input from the output without degrading available voltage headroom.

With reference to FIG. 8, a differential low noise amplifier, LNA, 80 in accord with the present invention includes a true branch 80T and a complementary branch 80C. The true branch 80T of LNA 80 includes a first (true) transistor MT for receiving a true signal, a first gate inductance LgT coupled to the control gate of MT, a first source inductance LsT coupling the source node of MT to a virtual ground node Vgnd, a first drain inductance LdT coupling the drain of MT to Vcc, a first voltage bias generator VBT, a first input coupling capacitor CT, a first input signal VinT, and the first input signal's corresponding source impedance RsT.

In the present case, true and complementary transistors MT and MC, are implemented as metal oxide semiconductor, MOS, transistors, but it is to be understood that true and complementary transistors MT and MC may be implemented as bipolar junction transistors, junction field transistors or other known field effect transistors.

The complementary branch 80C of LNA 80 includes a second (complementary) transistor MC for receiving a complementary signal, a second gate inductance LgC coupled to the control gate of MC, a second source inductance LsC coupling the source node of MC to virtual ground node Vgnd, a second drain inductance LdT coupling the drain of MC to the reference high power rail Vcc, a second voltage bias generator VBC, a second coupling capacitor CC, a second input signal VinC, and the second input signal's corresponding source impedance RsC.

Virtual ground Vgnd is created by a tail current source Isrc that couples source inductances LsT and LsC to a reference ground power rail, GND.

Characteristic of the present embodiment is a first neutralizing variable capacitance CN1 coupling the control gate of true transistor MT to the drain of complementary transistor MC, and a second neutralizing variable capacitance CN2 coupling the control gate of complementary MC to the drain of true transistor MT.

Source inductances LsT and LsC, which may be inductors (integrated or discrete), established a desired input resistance at the respective control gates of transistors MT and MC. Typically, the input resistance is made to match the source resistance RsT or RsC of the appropriate input signal source, VinT or VinC. However, the amount of input resistance created by inductances LsT and LsC is dependent on frequency, and a purely resistive input impedance is achieved only when LsT and LsC operate at resonance. Therefore, once the appropriate value of LsT and LsC for the required input resistance is obtain, gate inductances LgT and LgC are sized to provide enough input inductance to push the input loop of true and complementary branches 80T and 80C into resonance operation. Drain inductances LdT and LdC, in conjunction with the respective drain capacitances of MT and MC, provide bandpass filtering and additional gain for the output loop. Tail current source Isrc help isolates virtual ground node Vgnd from ground inductance fluctuations that might otherwise disturb the input resistances established by LsT and LsC.

Voltage bias generators VBT and VBC establish the operating points for true and complementary branches 80T and 80C of the present LNA. It is be understood that although two voltage bias generators (VBT and VBC) are shown, this is purely for illustrative purposes and a single voltage bias generator may be used to bias both branches 80T and 80C of LNA 80.

Coupling capacitors CT and CC provide DC blocking to prevent the DC component of an input signal from disturbing the gate-to-source biasing of their respective branch's input transistor MT and MC. Input signals VinT and VinC, and their corresponding output source impedances RsT and RsC, are shown as two separate sources, but it is to be understood that they may be part of a single differential output driver. It is further to be understood that that VinT/RsT and VinC/RsC may originate from a reception antenna, or step-down transformer, or any other reception technique commonly known in the art.

The present invention seeks to neutralize the effects of the gate-to-drain capacitance, Cgd, of input transistors MT and MC in order to isolate the input from the output of each respective branch of the present LNA. Since the present LNA is a differential LNA, the control gates, i.e. inputs, of transistors MT and MC received input signals that are the logic complement of each other, i.e. the input signals are 180° output phase with respect to each other. Consequently, the outputs of each branch 80T and 80C are likewise 180° output of phase with respect to each other. Thus, a signal at the drain of MT will be 180° out of phase with a signal at the drain of MC. Therefore, if the capacitance value of the first neutralizing variable capacitance CN1 is exactly equal to the capacitance value of the Cgd of MT, and since the gate-to-drain potential (Vgd) from the control gate of MT to the drain of MT is 180° out of phase with the potential across CN1 (i.e. the potential from the control gate of MT to the drain of MC), any current through the Cgd of MT will be neutralized by a current of equal magnitude and opposite orientation through neutralizing variable capacitance CN1. Second neutralizing capacitance CN2 has a similar neutralizing effect on the Cgd of complementary input transistor MC. In this manner, the Cgd capacitive coupling of MT and MC may be neutralized and the outputs may be effectively isolated from the inputs of the true 80T and complementary 80C branches of LNA 80.

However, although the control gate of an MOS transistor, such as MT or MC, is often thought of as a parallel plate capacitor, it does not have a fixed pure capacitance value. Firstly, the lower plate (i.e. the transistor channel region constructed in semiconductor substrate) of a capacitor formed by an MOS transistor does not have fixed dimensions. The effective lower plate of an MOS transistor will vary not only by the potential applied to the transistor's control gate, but also by the potential difference across its source and drain regions. That is, the inversion channel formed in an MOS transistor, i.e. the lower plate of an equivalent parallel capacitor, will have a rather tapered shape as it traverses from the source to the drain if there is a potential difference across the channel between the source and drain. However, the inversion channel will have a relatively non-tapered shape if the transistor's source and drain regions are tied to substantially the same potential. Additionally, the thickness, i.e. depth, of the channel will also be dependent upon the applied potential at the control gate of the MOS transistor. Related to this phenomena is that the amount of overlap between a source or drain region and the control gate will also vary with potential applied to the source or drain regions.

Therefore in the presently preferred embodiment, CN1 and CN2 are made to vary not only with an applied potential at the control gate of MT and MC, respectively, but also with a varying potential between the drain and source regions of MT and MC, respectively.

As it would be understood, these requirements complicate the construction of variable neutralizing capacitors CN1 and CN2. Integrated circuit capacitors are typically constructed by tying together the source and drain electrodes of an MOS transistor, and using this tied junction as the lower plate node of an equivalent parallel plate capacitor (the control gate of the this MOS transistor structure constitutes the upper plate of the equivalent parallel capacitor). However as explained above, the source and drain potentials of input MOS transistors MT and MC are not necessarily equal, and are definitely not fixed to a common potential since the drain potential of MT (or MC) will vary with an output signal while the source region is coupled to virtual ground Vgnd through a corresponding source inductance, LsT (or LsC). Furthermore, tying together the source and drain electrodes of the basic MOS transistor to form a capacitor has the effect of combining the basic transistor's Cgs and Cgd capacitances such that the combine, equivalent capacitance will assuredly differ the single Cgd capacitance of MT (or MC) (assuming that the basic MOS transistor is similarly sized as input transistor MT (or MC)). Therefore, the customary approach for creating matching integrated capacitors is not likely to be very effective. This is especially true since the neutralizing effect being sought depends heavily on exact matching of Cgd and neutralizing capacitances, and any mismatch my lead to unstable oscillation through the neutralizing capacitances.

In other words, creation of matching neutralizing capacitors is complicated because one is not seeking to match the entire input capacitance of transistor MT or MC, which is typically the case when matching transistors are used to create matching capacitances. Rather, one is seeking to match only the gate-to-drain capacitance, Cgd, of MT and MC.

As explained above, the prior art uses cascode input stages to isolate the input from the output, but a cascode requires two transistors in series. Since each transistor in the cascode experiences a voltage drop, requiring two transistors in series at the input stage reduces the available voltage headroom.

Figure 9:
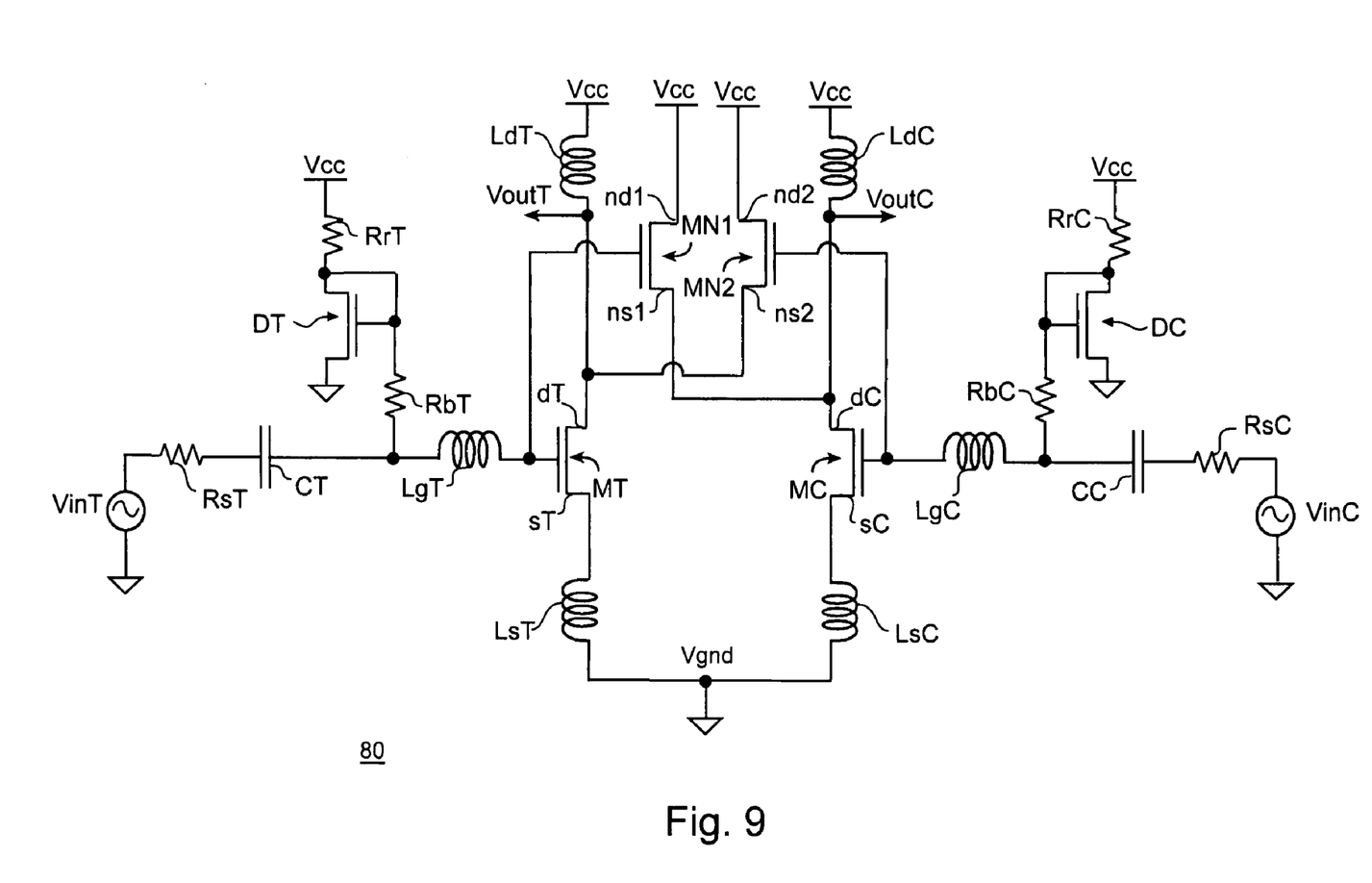
FIG. 9 is a circuit implementation of a differential LNA in accord with the present invention.

With reference to FIG. 9, all elements similar to those of FIG. 8 have similar reference characters and are described above. In the present case, sample circuit structures for voltage bias generators VBT and VBC are shown. Voltage bias generator VBT consists of a reference resistor RrT in series with a diode-connected transistor DT. A bias resistor RbT couples the gate of diode-connected transistor DT to the gate of input transistor MT. The reference current through diode-connected transistor DT is determined by the value of RrT and the voltage difference between Vcc and the Vgs of transistor DT. Reference resistor RrT would typically be made large enough so to permit its noise current is to be ignored. Transistor DT forms a current mirror with input transistor MT to establish the operating point of input transistor MT.

Operation of VBC is similar to that of VBT. Diode connected transistor DC forms a current mirror with complementary input transistor MC by means of a bias resistor RbC, which coupled the control gate of DC to the control gate of MC. The operating point is determined by the voltage drop across reference resistor RrC, and this voltage drop is determine by the magnitude of RrC and the Vcc-Vgs of DC.

For simplicity sake, tale current source Isrc and hard ground GND of FIG. 8 are not shown, and are instead replaced by a reference ground, gnd. This is because virtual ground Vgnd functions as the reference lower power rail for LNA 80. It is to be understood that reference ground, gnd, may be constructed by means of tale current source Isrc between LsT/LsC and GND.

The present embodiment uses cross coupled neutralizing transistors MN1 and MN2 at the inputs to provide a better way to improve the isolation between the input and the output, without losing headroom. Transistors MN1 and MN2 perform a function similar to variable neutralizing capacitances CN1 and CN2 of FIG. 8, and effectively provide isolation with without losing headroom or adding noise to the LNA circuitry, 80.

Like in FIG. 8, MT and MC are true and complementary input transistors. The transistors MN1 and MN2 compensate for the Miller effect on input transistors MT and MC, as more fully explained below. In this way, the present invention achieves a similar isolation as with the cascode topology of FIG. 7, while retaining a maximum voltage swing similar to that of the basic differential LNA of FIG. 5. In effect, the technique of the present invention combines advantages of the circuits of FIGS. 5 and 7 without degrading other parameters of an LNA, including noise figure and linearity.

Preferably, neutralizing transistor MN1 is matched to true input transistor MT, and neutralizing transistor MN2 is matched to complementary input transistor MC. Further preferably, MN1, MN2, MT, and MC are all matched to each other, and are symmetrical. Specifically, the transistor cell architecture of their source region is preferably similar to their drain region. In this way, there is substantially no structural difference between their respective source and drain regions, and each region can operate as a source or drain, depending on the flow of current. That is, conventionally the region that is closer to the high power rail, i.e. Vcc, is typically designated the drain region and the region that is closer to the lower power rail, i.e. gnd, is typically designated the source region. Therefore, although the nodes nd1 and nd2 of respective neutralizing transistors MN1 and MN2, are closer to Vcc and would therefore be designated the drains, the source regions of MN1 and MN2 at nodes ns1 and ns2 have a similar structure as the drains dT and dC of input transistors MT and MC, respectively. Therefore, for purposes of matching capacitances, the inherent at-rest gate-to-source capacitances of neutralizing transistors MN1 and MN2 are matched to the inherent at-rest gate-to-drain capacitances of (i.e. when no signal is applied to) input transistors MT and MC, respectively.

In the present case, input signals from VinT and VinC travel through the input transistors MT and MC with some feedback from the output to the input. This feedback would occur through the Cgd capacitances of MT and MC. By means of neutralization transistors MN1 and MN2, a similar waveform of opposite phase through the Cgs capacitances of MN1 and MN2 would reach the true and complementary outputs. In this way the waveform through the Cgd of MT added to the waveform having an 180° phase shift through the Cgs of MN1 will cancel each other out.

Operation of the present invention can also be understood as follows. When true input transistor MT outputs a logic high, its drain node dT will be at a high potential. Since the source node sT of MT is at a low potential, a voltage difference exists across the source and drain of MT. Concurrently if the output of MT is at a logic high, then the drain node dC of complementary input transistor MC must be at a logic low. Therefore, the source of ns1 of neutralizing transistor MN1 is likewise at a low potential. Since the drain nd1 of neutralizing transistor MN1 is at high potential (i.e. tied to Vcc), a voltage difference across the source and drain regions of neutralizing transistor MN1 is likewise created. Therefore, the shape of the effective bottom plate of an equivalent capacitor constituted by MN1 would more closely match the shape of the effective bottom plate of an equivalent capacitor constituted by true input transistor MT. Furthermore, since the structure of the source region ns1 of neutralizing transistor MN1 is matched to the structure of the drain region dT of true input transistor MT, the Cgs value of MN1 will match very closely the Cgd value of MT in spite of the varying potential at the control gate of MT and the varying potential difference across the source and drain of MT.

Similarly, if the output of MT is at a logic high, then the output of complementary transistor MC is necessarily at a logic low. Consequently, the drain dC and source sC of complementary input transistor MC will be at substantially similar potentials, resulting in a relatively level bottom plate for an equivalent parallel plate capacitor. However, since the source region ns2 of neutralizing transistor MN2 is tied to the logic high potential at the output of true input transitory MT, and the drain region nd2 of neutralizing transistor MN2 is likewise tied to a logic high potential at Vcc, both the drain and source regions of MN2 will likewise be at similar potentials. Therefore, the effective bottom plate of an equivalent parallel plate capacitor for MN2 would also be relatively level, i.e. flat. Thus the effective bottom plates of equivalent capacitors for MN2 and MC are effectively matched. Furthermore, since the source region ns2 of MN2 is matched to the drain region dC of MC, the Cgd value of MC is matched to the Cgs value of MN2 in spite of the applied signal at the control gate of MC and the resultant source-to-drain potential difference across MC.

It is to be understood that the converse is likewise true when the output of MT is at a logic low, and the output of MC is at a logic high. In this case, a logic low will be at the drain of MT, and its source and drain regions will be at similar logic low potentials. However, the drain of MC, and consequently the source of MN1, will be at a high potential. Therefore, the source and drain regions of MN1 will also be at similar logic high potentials. Therefore the shape of the bottom plate of MN1 will closely match the shape of the bottom plate of MT. Furthermore, neutralizing transistor MN1 again exhibits an a Cgs capacitance value that matches the Cgd capacitance value of MT, and thereby provides a neutralizing signal 180° out of phase with an input signal at the control gate of MT. Since the drain of MC is at a high potential while its source is at a logic low, a source-to-drain potential differential is generated. This potential difference is matched by the potential difference across the source and drain of MN2, whose source is likewise at a logic low and whose drain is at a logic high. Also like before, the Cgs of MN2 will match the Cgd of MC and provide appropriate capacitance neutralization.

As a result, the structure of the present invention is able to provide a variable capacitance cross-coupled between the inputs and outputs of a differential LNA which accurately tracts changes in the gate-to-drain capacitances of input transistors MT and MC as their input and output voltages vary.

Initial tests of the structure of FIG. 9 indicate a great improvement over the prior art. Typically, isolation in an LNA is defined in terms of S parameters (i.e. scattering parameters); and specifically in terms of parameter S21 (i.e. the insertion loss parameter). S parameters are generally known in the field of high frequency applications, and are generally used in radio frequency and microwave circuitry. Therefore, a detailed explanation of S parameters is not provided here. Generally, however, a smaller value of S21 means better performance. Using this approach, 20 log S21 is a measure of the isolation, and the noise figure, NF, is defined as 10 log (SNRin/SNRout), where SNR is the signal-to-noise ratio. Typically, S21 (in terms of decibels, dB) is lower than 10 dB for LNA specifications, as compared to other S parameters. In the case of present invention, the isolation is improved by as much as 15 dB, as compared to the classical differential LNA of FIG. 5.

Figure 10:
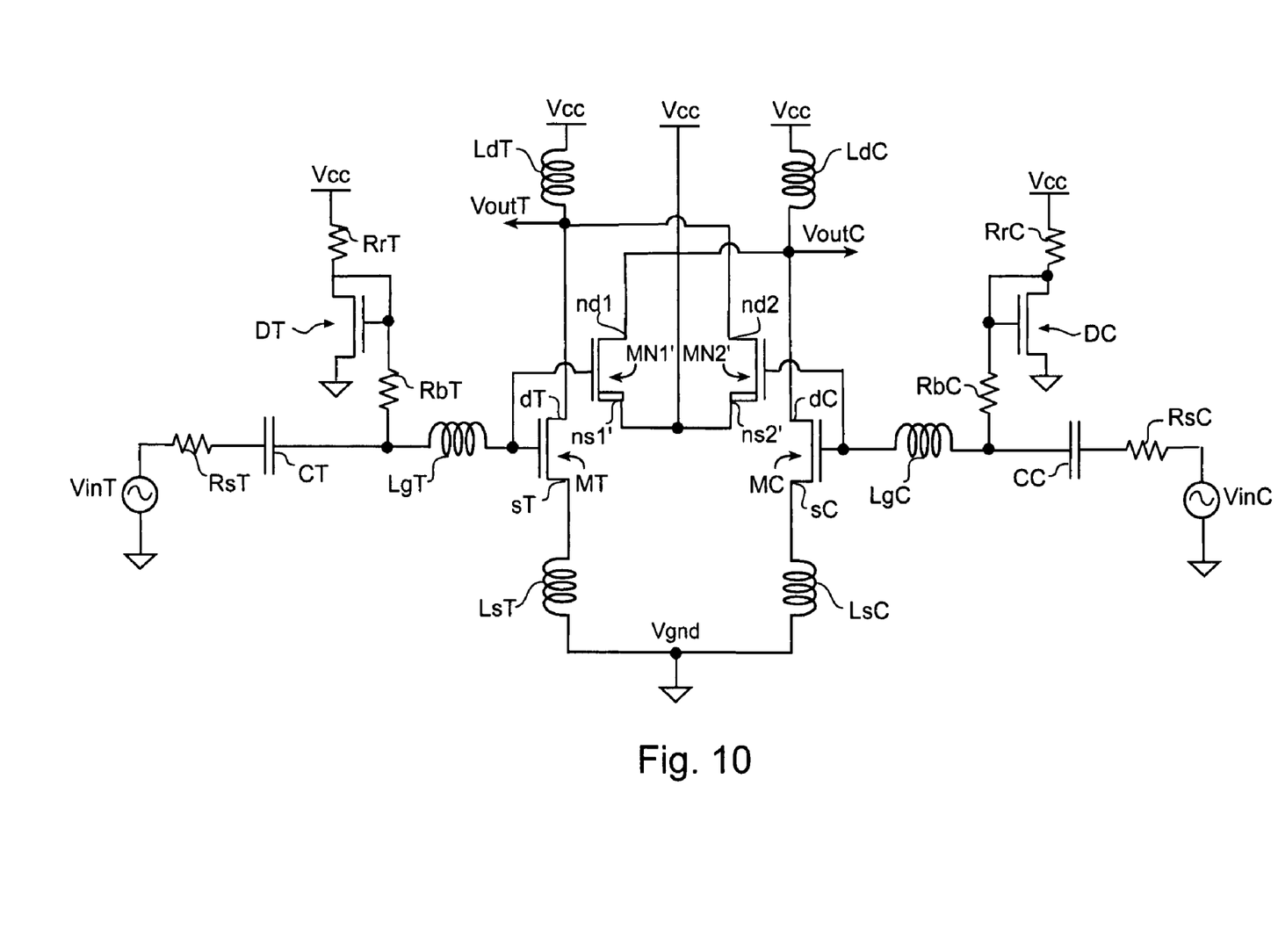
FIG. 10 is a circuit implementation of the LNA of FIG. 9 using non-symmetrical neutralizing transistors.

There may be occasion when neutralizing transistors are not symmetrical. FIG. 10 shows a case where neutralizing transistors MN1' and MN2' have asymmetric source (ns1' and ns2') and drain (nd1 and nd2) regions. That is, the structure of source regions ns1' and ns2' is physically different than that of the structure of drain regions nd1 and nd2. For example, source regions ns1' and ns2' may have lightly doped structures while drain regions nd1 and nd2 may not. This might be the case if source regions ns1' and ns2' are intended to withstand relatively large voltage potentials. In FIG. 10, all elements similar to those of FIGS. 9 have similar reference characters and are described above.

The structure of drain regions nd1 and nd2 of neutralizing transistors MN1' and MN2' are preferably matched to drains dT and dC of input transistors MT and MC, respectively. In the present case, drain nd1 of MN1 would be used to neutralize the Cgd of true input transistor MT, and drain nd2 of MN2' would be used to neutralize the Cgd of complement input transistor MC. Thus, the control gate of MN1' is again coupled to the control gate of MT, but drain nd1 of MN1' is coupled to drain dC of MC. Similarly, the control gate of MN2' is coupled to the control gate of MC and drain nd2 of MN2' is coupled to drain dT of MT. Source regions, ns1' and ns2' of neutralizing transistors MN1' and MN2' are preferably coupled to a fixed power rail, such as Vcc. Source regions ns1' and ns2' are further preferably tied together. In this manner, the Cgd of MN1' tracks and cancels the feedback signal through the Cgd of MT, and the Cgd of MN2' tracks and cancels the feedback signal through the Cgd of MC.

In the present embodiment, source region ns1' of neutralizing transistor MN1' may not be matched to source region sT of true input transistor MT. Similarly, source region ns2' of neutralizing transistor MN2' may not be matched to source region sC of complement input transistor MC. Thus, in the present embodiment, it is not necessary for neutralizing transistors MN1' and MN2' to matched to input transistors MT and MC, respectively.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A differential amplifier, comprising:
a first input transistor having a first node coupled to a first pull-up device, a second node coupled to a first pull-down device, and a first control input node effective for receiving a true input signal, said first input transistor being characterized by a first feedback capacitance between said first control input node and said first node and by a first coupling capacitance between said first control input node and said second node, said first feedback capacitance being at least partially dependent on said true input signal;
a second input transistor having a third node coupled to a second pull-up device, a fourth node coupled to a second pull-down device, and a second control input node effective for receiving a complement input signal, said complement input signal being the inverse of said true input signal, said second input transistor being characterized by a second feedback capacitance between said second control input node and said third node and by a second coupling capacitance between said second control input and said fourth node, said second feedback capacitance being at least partially dependent upon said complement input signal;
a first compensating variable capacitance coupled between said first input node and said third node, said first compensating variable capacitance having an at-rest capacitance magnitude substantially similar to the at-rest capacitance magnitude of said first feedback capacitance;
a second compensating variable capacitance coupled between said second input node and said first node, said second compensating variable capacitance having an at-rest capacitance magnitude substantially similar to the at-rest capacitance magnitude of said second feedback capacitance.

2. The differential amplifier of claim 1, wherein the magnitude of a feedback signal through said first feedback capacitance is at least partially dependent upon a potential difference between said first and second nodes, and said first compensating variable capacitance is effective for providing a neutralizing signal from said third node to said first control input node, the magnitude of said neutralizing signal being varied with a change in the potential difference between said first and second nodes.

3. The differential amplifier of claim 1, wherein:
said first compensating variable capacitance tracks changes in said first feedback capacitance and substantially disregards changes in said first coupling capacitance; and
said second compensating variable capacitance tracks changes in said second feedback capacitance and substantially disregards changes in said second coupling capacitance.

4. The differential amplifier of claim 1, wherein said first and second input transistors are field effect transistors or bipolar junction transistors.

5. The differential amplifier of claim 1, wherein:
said first compensating variable capacitance is embodied by a first compensating transistor having a third input node coupled to said first input node, a fifth node coupled to said third node, and a sixth node coupled to a power rail;
said second variable capacitance is embodied by a second compensating transistor having a fourth input node coupled to said second input node, a seventh node coupled to said first node, and an eighth node coupled to said power rail.

6. The differential amplifier of claim 5, wherein:
said first compensating transistor is not matched to said first input transistor; and
said second compensating transistor is not matched to said second input transistor.

7. The differential amplifier of claim 1 wherein:
said first input transistor is a first MOS transistor and said first node, second node, and first control input node are respective first drain node, first source node, and first control gate of said first MOS transistor;
said second input transistor is a second MOS transistor and said third node, fourth node, and second control input are respective second drain node, second source node, and second control gate of said second MOS transistor;
said first compensating variable capacitance is embodied by a third MOS transistor having a third source node coupled to a fixed potential, a third drain node coupled to said second drain node, and a third control gate coupled to said first control gate, the gate-to-drain capacitance of said third MOS transistor being matched to the gate-to-drain capacitance of said first MOS transistor;
said second compensating variable capacitance is embodied by a fourth MOS transistor having a fourth source node coupled to said fixed potential, a fourth drain node coupled to said first drain node, and a fourth control gate coupled to said second control gate, the gate-to-drain capacitance of said fourth MOS transistor being matched to the gate-to-drain capacitance of said second MOS transistor.

8. The differential amplifier of claim 7, wherein:
the gate-to-source capacitance of said third MOS transistor is matched to the gate-to-source capacitance of said first MOS transistor; and
the gate-to-source capacitance of said fourth MOS transistor is not matched to the gate-to-drain capacitance of said second MOS transistor.

9. The differential amplifier of claim 1, wherein:
said differential amplifier is a low noise amplifier, LNA; and
said first and second pull-down devices are inductive devices.

10. A differential amplifier, comprising:
a first power rail and a second power rail, said second power rail being of lower potential than said first power rail;
a first input MOS transistor having a first drain node coupled to said first power rail through a first pull-up device, a first source node coupled to said second power rail through a first pull-down device, and a first control gate input node effective for receiving a true input signal;
a second input MOS transistor having a second drain node coupled to said first power rail through a second pull-up device, a second source node coupled to said second power rail through a second pull-down device, and a second control gate input node for receiving a complement input signal, said complement input signal being the inverse of said true input signal;

a first compensating variable MOS transistor having a first compensating control gate coupled to said first control gate input node, a first compensating source node coupled to said second drain node, and a first compensating drain node directly connected to one of said first or second power rails;

a second compensating variable MOS transistor having a second compensating control gate coupled to said second control gate input node, a second compensating source node coupled to said first drain node, and a second compensating drain node directly connected to the same one of said first or second power rails as said first compensating drain node.

11. The differential amplifier of claim 10, wherein a potential difference between said first drain node and said first source node results in a potential difference of similar magnitude between said first compensating source node and said first compensating drain node.

12. The differential amplifier of claim 10 wherein:
the drain region of said first input MOS transistor is matched to the drain region of said first compensating variable MOS transistor; and
the drain region of said second input MOS transistor is matched to the drain region said second compensating variable MOS transistor.

13. The differential amplifier of claim 12, wherein:
the source region of said first input MOS transistor is not matched to the source region of said first compensating MOS transistor; and
the source region of said second input MOS transistor is not matched to the source region said second compensating MOS transistor.

14. The differential amplifier of claim 10, wherein:
said differential amplifier is a low noise amplifier, LNA;
said first and second pull-up devices are first and second pull-up inductive devices; and
first and second pull-down devices are first and second pull-down inductive devices.

15. The differential amplifier of claim 14 wherein:
said first pull-down inductive device is selected such that when combined with the reactive behavior of said first input MOS transistor and when operating within its resonance range, the first pull-down inductive device produces an input impedance at said first control gate input node having a real resistance component substantially similar to a predetermined input resistance value; and
said second pull-down inductive device is selected such that when combined with the reactive behavior of said second input MOS transistor and when operated within its resonance range, the second pull-down inductive device produces an input impedance at said second control gate input node having a real resistance component substantially similar to said predetermined input resistance value.

16. The differential amplifier of claim 15 further comprising:
a first input inductive device coupled to said first control gate input node, wherein the inductance value of said first input inductive device is selected to place said first pull-down inductive device within its resonance range;
a second input inductive device coupled to said second control gate input node, wherein the inductance value of said second input inductive device is selected to place said first pull-down inductive device within its resonance range.

17. The differential amplifier of claim 16 further comprising a bias generating circuit coupled to said first and second control gate input nodes, said bias generating circuit being effective for establishing an operating point for said low noise amplifier.

18. A differential amplifier, comprising:
a first power rail and a second power rail, said second power rail being of lower potential than said first power rail;
a first input MOS transistor having a first drain node coupled to said first power rail through a first pull-up device, a first source node coupled to said second power rail through a first pull-down device, and a first control gate input node effective for receiving a true input signal;
a second input MOS transistor having a second drain node coupled to said first power rail through a second pull-up device, a second source node coupled to said second power rail through a second pull-down device, and a second control gate input node for receiving a complement input signal, said complement input signal being the inverse of said true input signal;
a first compensating variable MOS transistor having a first compensating control gate coupled to said first control gate input node, a first compensating drain node coupled to said second drain node, and a first compensating source node coupled to one of said first or second power rails, wherein the drain structure of said first compensating variable MOS transistor is matched to the drain structure of said first input MOS transistor;
a second compensating variable MOS transistor having a second compensating control gate coupled to said second control gate input node, a second compensating drain node coupled to said first drain node, and a second compensating source node coupled to said first compensating source node, wherein the drain structure of said second compensating variable MOS transistor is matched to the drain structure of said second input MOS transistor.

19. The differential amplifier of claim 18, wherein said first compensating source node is structurally different than said first compensating drain node.

20. The differential amplifier of claim 19, wherein said second compensating source node is structurally different than said second compensating drain node.

21. The differential amplifier of claim 18, wherein said first compensating variable MOS transistor is not matched to said first input MOS transistor.

22. The differential amplifier of claim 21, wherein said second compensating variable MOS transistor is not matched to said second input MOS transistor.

23. The differential amplifier of claim 18, wherein a potential difference between said first drain node and said first source node results in a potential difference of similar magnitude across said first compensating source node and said first compensating drain node.

24. The differential amplifier of claim 18, wherein said amplifier is a low noise amplifier, LNA, and said first and second pull-down devices are inductive devices.

* * * * *